US010825843B2

(12) United States Patent
Ueda et al.

(10) Patent No.: US 10,825,843 B2
(45) Date of Patent: Nov. 3, 2020

(54) ACTIVE MATRIX SUBSTRATE AND METHOD FOR PRODUCING SAME

(71) Applicant: Sharp Kabushiki Kaisha, Sakai (JP)

(72) Inventors: Teruyuki Ueda, Sakai (JP); Hideki Kitagawa, Sakai (JP); Tohru Daitoh, Sakai (JP); Hajime Imai, Sakai (JP); Masahiko Suzuki, Sakai (JP); Setsuji Nishimiya, Sakai (JP); Tetsuo Kikuchi, Sakai (JP); Toshikatsu Itoh, Sakai (JP); Kengo Hara, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/343,024

(22) PCT Filed: Oct. 12, 2017

(86) PCT No.: PCT/JP2017/037038
§ 371 (c)(1),
(2) Date: Apr. 18, 2019

(87) PCT Pub. No.: WO2018/074324
PCT Pub. Date: Apr. 26, 2018

(65) Prior Publication Data
US 2020/0058678 A1 Feb. 20, 2020

(30) Foreign Application Priority Data
Oct. 19, 2016 (JP) ................................. 2016-205353

(51) Int. Cl.
H01L 27/12 (2006.01)
H01L 27/02 (2006.01)
(Continued)

(52) U.S. Cl.
CPC .......... H01L 27/124 (2013.01); G02F 1/1368 (2013.01); G02F 1/136204 (2013.01);
(Continued)

(58) Field of Classification Search
CPC ............... H01L 27/124; H01L 27/0292; H01L 27/0296; H01L 27/1225; H01L 27/1255;
(Continued)

(56) References Cited

U.S. PATENT DOCUMENTS

2012/0138922 A1   6/2012  Yamazaki et al.
2013/0147724 A1*  6/2013  Hwang ................ G06F 3/0416
                                                    345/173
(Continued)

FOREIGN PATENT DOCUMENTS

CN   105408813 A   3/2016
JP   2010-003910 A  1/2010
(Continued)

OTHER PUBLICATIONS

Official Communication issued in International Patent Application No. PCT/JP2017/037038, dated Dec. 26, 2017.

Primary Examiner — Mark W Tornow
(74) Attorney, Agent, or Firm — Keating & Bennett, LLP

(57) ABSTRACT

Provided is an active matrix substrate (100A) including: a gate metal layer (15) that has a two-layer structure composed of a Cu layer (15b) and a Ti layer (15a); a first insulating layer (16) on the gate metal layer (15); a source metal layer (18) that is formed on the first insulating layer (16) and has a two-layer structure composed of a Cu layer (18b) and a Ti layer (18a); a second insulating layer (19) on the source metal layer (18); a conductive layer (25) that is formed on the second insulating layer (19), and is in contact with the gate metal layer (15) within a first opening (16a1) formed in the first insulating layer (16) and is in contact with
(Continued)

the source metal layer (18) within a second opening (19a2) formed in the second insulating layer (19); and a first transparent conductive layer (21) that is formed on the conductive layer (25) and includes any of a pixel electrode, a common electrode and an auxiliary capacitor electrode. The conductive layer (25) does not include any of the pixel electrode, the common electrode, and the auxiliary capacitor electrode, and does not have a Ti layer being in contact with the Cu layer (15b) of the gate metal layer (15).

11 Claims, 7 Drawing Sheets

(51) Int. Cl.
    *H01L 29/45*     (2006.01)
    *H01L 29/49*     (2006.01)
    *H01L 29/786*     (2006.01)
    *G02F 1/1362*     (2006.01)
    *G02F 1/1368*     (2006.01)
    *G02F 1/1343*     (2006.01)

(52) U.S. Cl.
    CPC .... *G02F 1/136286* (2013.01); *H01L 27/0292* (2013.01); *H01L 27/0296* (2013.01); *H01L 27/1225* (2013.01); *H01L 27/1255* (2013.01); *H01L 27/1259* (2013.01); *H01L 29/45* (2013.01); *H01L 29/4908* (2013.01); *G02F 1/134363* (2013.01); *G02F 2001/136295* (2013.01); *H01L 29/7869* (2013.01)

(58) Field of Classification Search
    CPC . H01L 27/1259; H01L 29/45; H01L 29/4908; G02F 1/136204; G02F 1/136286; G02F 1/1368

See application file for complete search history.

(56) References Cited

U.S. PATENT DOCUMENTS

| | | |
|---|---|---|
| 2013/0320334 A1 | 12/2013 | Yamazaki et al. |
| 2014/0131700 A1 | 5/2014 | Yamazaki |
| 2014/0286076 A1 | 9/2014 | Aoki et al. |
| 2015/0055051 A1 | 2/2015 | Osawa et al. |
| 2015/0168758 A1* | 6/2015 | Nakata ............. G02F 1/136286 349/43 |
| 2015/0200303 A1* | 7/2015 | Uchida ............... H01L 29/7869 257/43 |
| 2015/0316802 A1* | 11/2015 | Takanishi .......... G02F 1/136227 349/43 |
| 2016/0336386 A1 | 11/2016 | Saito |
| 2019/0004647 A1 | 1/2019 | Yamashita et al. |

FOREIGN PATENT DOCUMENTS

| | | |
|---|---|---|
| JP | 2012-134475 A | 7/2012 |
| JP | 2013-122752 A | 6/2013 |
| JP | 2014-7399 A | 1/2014 |
| JP | 2014-116597 A | 6/2014 |
| JP | 2014-209727 A | 11/2014 |
| WO | 2013/073619 A1 | 5/2013 |
| WO | 2014/034566 A1 | 3/2014 |
| WO | 2015/087466 A1 | 6/2015 |
| WO | 2017/014252 A1 | 1/2017 |
| WO | 2017/213175 A1 | 12/2017 |

* cited by examiner

ACTIVE MATRIX SUBSTRATE AND METHOD FOR PRODUCING SAME

TECHNICAL FIELD

The present invention relates to an active matrix substrate and a method for producing the same, and more specifically, to an active matrix substrate and a method for producing the same, suitably used for an active matrix type display device such as a liquid crystal display device and an organic EL display device, and further for a display device having a touch screen function.

BACKGROUND ART

The active matrix substrate of the display device includes, for example, a thin film transistor (hereinafter referred to as "TFT") as a switching element for each pixel. Throughout the description, such a TFT is referred to as "pixel TFT". In the related art, as pixel TFTs, amorphous silicon TFTs using an amorphous silicon film as a semiconductor layer and crystalline silicon TFTs using a crystalline silicon film such as a polycrystalline silicon film as a semiconductor layer are widely used.

Part or all of peripheral drive circuits may be integrally formed on the same substrate as the pixel TFT. Such an active matrix substrate is referred to as a driver monolithic active matrix substrate. In the driver monolithic active matrix substrate, the peripheral drive circuits are provided in a region (non-display region or a frame region) other than a region (display region) including a plurality of pixels. The pixel TFT and a TFT (circuit TFT) forming the drive circuits may be formed using the same semiconductor film. As such a semiconductor film, a polycrystalline silicon film having high field effect mobility is used, for example.

In addition, TFTs using oxide semiconductors as a material of a semiconductor layer of TFT have been put into practical use. As an oxide semiconductor, for example, an In—Ga—Zn—O-based semiconductor containing indium, gallium, zinc and oxygen as a main component is used. Such a TFT is referred to as an "oxide semiconductor TFT". An oxide semiconductor has higher mobility than amorphous silicon. Therefore, the oxide semiconductor TFT may be operated with a higher speed than the amorphous silicon TFT. In addition, since the oxide semiconductor film is formed by a process simpler than the polycrystalline silicon film, the oxide semiconductor film may also be applied to an apparatus requiring a large area. Therefore, it is also possible to integrally form the pixel TFT and the circuit TFT on the same substrate by using the oxide semiconductor film.

Crystalline silicon TFTs and/or oxide semiconductor TFTs are used for display devices requiring high-definition and/or high-speed operation, and copper (Cu) wiring is used. For example, in PTL 1, a display device is disclosed having a conductive layer having a two-layer structure composed of a copper (Cu) layer and a titanium (Ti) layer (upper layer and lower layer) as a gate metal layer including a gate bus line and a source metal layer including a source bus line. In addition, PTL 1 discloses (for example, in FIG. 4) a structure (sometimes referred to as "direct type") of a connection portion (referred to as "S-G connection portion") between the source metal layer and the gate metal layer, in which the source metal layer and the gate metal layer are directly connected to each other, for example, without having a transparent conductive layer same as the pixel electrode therebetween.

For example, the S-G connection portion is a portion where a drive circuit provided in the peripheral region of the display region of the active matrix substrate (that is, a region of the active matrix substrate that corresponds to the display region of the display device) is connected to the gate bus line or the source bus line, and is provided to connect wiring or an electrode formed of a source metal layer and wiring or an electrode formed of a gate metal layer in a terminal portion (connected to an external circuit) provided in the peripheral region.

CITATION LIST

Patent Literature

PTL 1: International Publication No. 2013/073619

SUMMARY OF INVENTION

Technical Problem

However, according to researches of the present inventors, it has been found that when a gate metal layer composed of a Cu layer and a Ti layer and a source metal layer composed of a Cu layer and a Ti layer are directly connected, an electrical connection failure may arise, which results in lowered yield. While the mechanism of such electrical connection failure is not well understood, since the source metal layer formed on the gate metal layer is discolored (whitish) in the portion where the gate metal layer and the source metal layer are in direct contact with each other and the periphery thereof, it is considered that the Cu layer and the Ti layer of the source metal layer are deteriorated.

The present invention has been made to solve the above problems, and an aspect of the present invention is to provide an active matrix substrate capable of suppressing reduction in yield and a method for producing the same.

Solution to Problem

An active matrix substrate according to an embodiment of the present invention includes a substrate, a gate metal layer that is supported on the substrate and has a two-layer structure composed of a Ti layer containing titanium, and a Cu layer containing copper and formed on the Ti layer, a first insulating layer formed on the gate metal layer, a source metal layer that is formed on the first insulating layer and has a two-layer structure composed of a Ti layer containing titanium, and a Cu layer containing copper and formed on the Ti layer, a second insulating layer formed on the source metal layer, a conductive layer that is formed on the second insulating layer, and is in contact with the gate metal layer within a first opening formed in the first insulating layer and is in contact with the source metal layer within a second opening formed in the second insulating layer, and a first transparent conductive layer that is formed on the conductive layer, and includes any of a plurality of pixel electrodes, at least one common electrode, and at least one auxiliary capacitor electrode, in which the conductive layer does not include any of the plurality of pixel electrodes, the at least one common electrode, and the at least one auxiliary capacitor electrode, and does not have a Ti layer being in contact with the Cu layer of the gate metal layer.

In the embodiment, the conductive layer has a two-layer structure composed of a transparent conductive layer, and a Cu layer containing copper and formed on the transparent conductive layer.

In the embodiment, the transparent conductive layer is formed of ITO.

In the embodiment, the active matrix substrate further includes a first thin film transistor that has a first gate electrode formed of the gate metal layer, a first source electrode and a first drain electrode which are formed of the source metal layer, and a first semiconductor layer including an oxide semiconductor and formed on the first insulating layer.

In the embodiment, the active matrix substrate further includes a gate bus line integrally formed with the first gate electrode, a source bus line integrally formed with the first source electrode, a dielectric layer formed on the conductive layer, and a second transparent conductive layer formed on the dielectric layer, in which the first transparent conductive layer includes the at least one common electrode, the second transparent conductive layer includes the plurality of pixel electrodes, the conductive layer includes auxiliary wiring extending parallel to the gate bus line or the source bus line, and the auxiliary wiring is in direct contact with the first transparent conductive layer.

In the embodiment, the active matrix substrate includes a gate bus line integrally formed with the first gate electrode, a source bus line integrally formed with the source bus line, a dielectric layer formed on the conductive layer, and a second transparent conductive layer formed on the dielectric layer, in which the first transparent conductive layer includes the plurality of pixel electrodes, the at least one common electrode is a plurality of common electrodes arranged in a matrix having rows and columns, and the second transparent conductive layer includes the plurality of common electrodes, the conductive layer includes a plurality of signal lines extending parallel to the source bus line, and each of the plurality of signal lines is connected to at least one of the plurality of common electrodes, and the plurality of signal lines transmit and receive a touch drive signal and a touch detection signal to and from a touch screen control circuit.

In the embodiment, the active matrix substrate further includes a second thin film transistor that has a second semiconductor layer containing silicon and formed on the substrate, a third insulating layer formed between the second semiconductor layer and the gate metal layer, a second gate electrode formed of the gate metal layer, and a second source electrode and a second drain electrode which are formed of the source metal layer.

In the embodiment, the oxide semiconductor includes an In—Ga—Zn—O-based semiconductor.

In the embodiment, the oxide semiconductor includes a crystalline In—Ga—Zn—O-based semiconductor.

In the embodiment, the first semiconductor layer has a stacked structure.

In the embodiment, the first thin film transistor is a channel etch type.

In the embodiment, the second semiconductor layer includes crystalline silicon.

In the embodiment, the crystalline silicon is polycrystalline silicon.

A method for producing the active matrix substrate according to another embodiment of the present invention is a method for producing any one of the active matrix substrates described above, which includes a step of preparing the substrate, a step of forming the gate metal layer on the substrate, a step of depositing a first insulating film on the gate metal layer, a step of forming the first semiconductor layer on the first insulating film, a step of forming the first opening in the first insulating film to obtain the first insulating layer, a step of forming the source metal layer on the first semiconductor layer, a step of depositing a second insulating film on the source metal layer and forming the second opening in the second insulating film to obtain the second insulating layer, and a step of forming the conductive layer on the second insulating layer.

A method for producing the active matrix substrate according to still another embodiment of the present invention is a method for producing any one of the active matrix substrates described above, which includes a step of preparing the substrate, a step of forming the gate metal layer on the substrate, a step of depositing a first insulating film on the gate metal layer, a step of forming the first semiconductor layer on the first insulating film, a step of forming the source metal layer on the first semiconductor layer, a step of depositing a second insulating film on the source metal layer, forming the second opening in the second insulating film, and then forming the first opening in the first insulating film to obtain the first insulating layer and the second insulating layer, and a step of forming the conductive layer on the second insulating layer.

Advantageous Effects of Invention

According to an embodiment of the present invention, an active matrix substrate capable of suppressing reduction in yield and a method for producing the same are provided.

DESCRIPTION OF EMBODIMENTS

Hereinafter, a structure of an active matrix substrate and a method for producing the same according to an embodiment of the present invention will be described with reference to the drawings. While the active matrix substrate exemplified below is a TFT substrate used in a liquid crystal display device in a fringe field switching (FFS) mode, the active matrix substrate according to the embodiment of the present invention is not limited thereto, and is also suitably used for liquid crystal display devices in other display modes (for example, vertical alignment mode). The active matrix substrate according to the embodiment of the present invention may be suitably used for other known active matrix type display devices such as an organic EL display device or the like. The active matrix substrate according to the embodiment of the present invention is also suitably used for a display device having a touch screen function.

Figure 1:
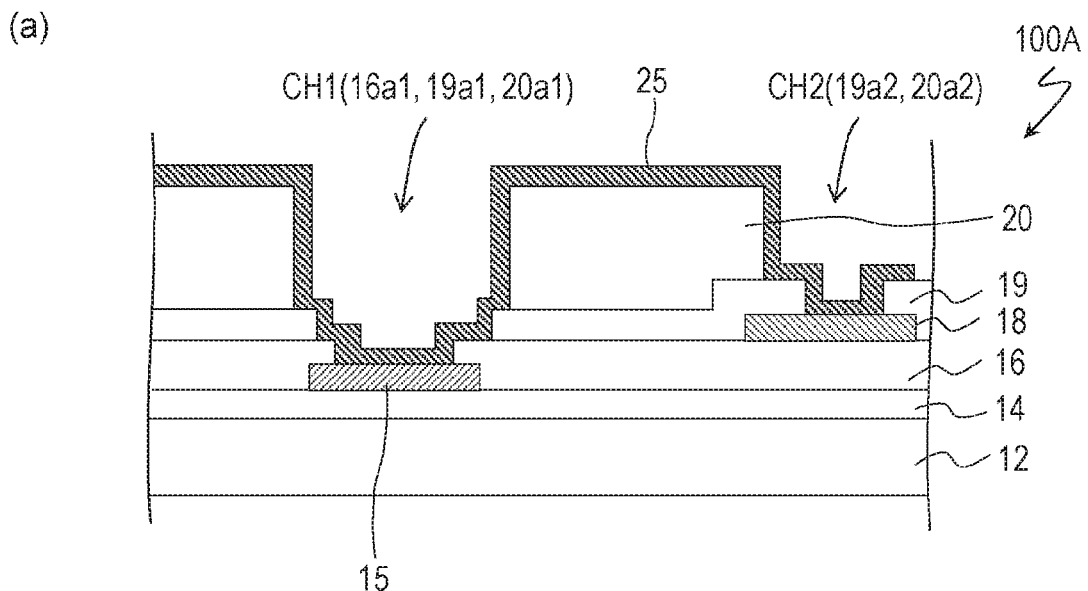
FIG. 1(a) is a schematic sectional view of an S-G connection portion included in a TFT substrate 100A according to an embodiment of the present invention.
FIG. 1(b) is a schematic sectional view of an S-G connection portion included in a TFT substrate 100B according to the embodiment of the present invention.
FIG. 1(c) is a schematic sectional view of a stacked structure of the S-G connection portions included in the TFT substrates 100A and 100B.
Figure 1:
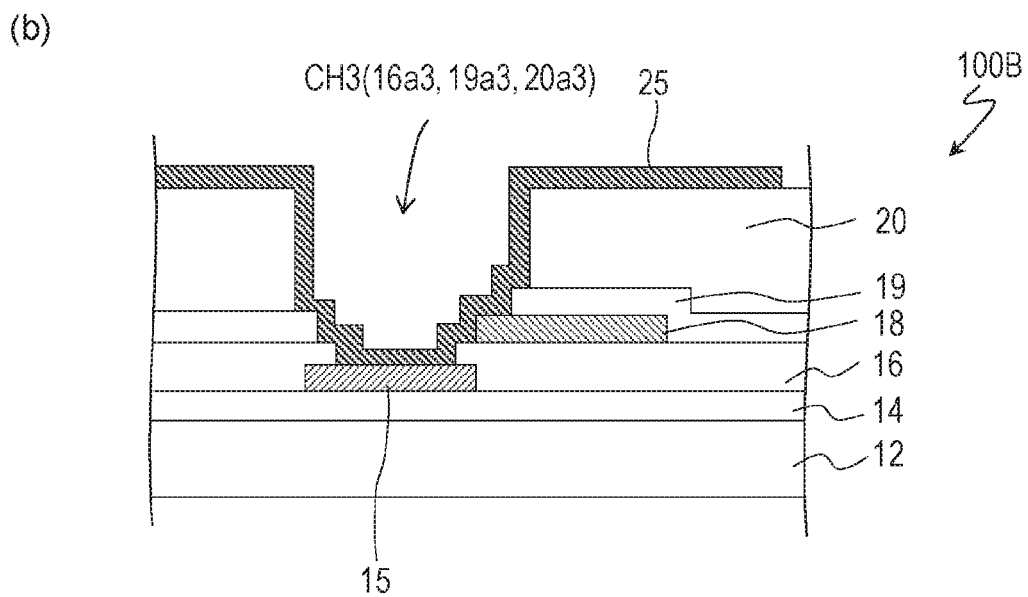
Figure 1:
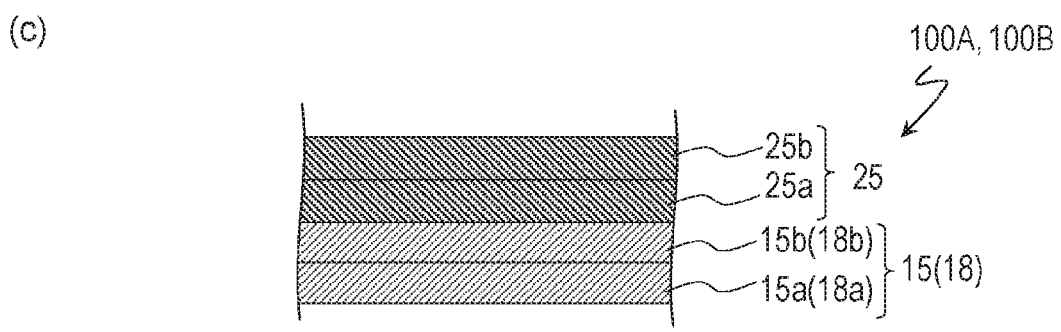

FIGS. 1(a) and 1(b) are schematic sectional views of S-G connection portions included in the TFT substrates 100A and 100B according to an embodiment of the present invention.

The TFT substrate 100A shown in FIG. 1(a) includes a substrate 12, a gate metal layer 15 supported on the substrate 12, a first insulating layer 16 that is formed on the gate metal layer 15, a source metal layer 18 formed on the first insulating layer 16, a second insulating layer 19 formed on the source metal layer 18, a conductive layer 25 that is formed on the second insulating layer 19 and is in contact with the gate metal layer 15 within a first opening 16a1 formed in the first insulating layer 16, and is in contact with the source metal layer 18 within a second opening 19a2 formed in the second insulating layer 19.

While FIG. 1(a) shows an example in which an organic insulating layer 20 is formed on the second insulating layer 19, the organic insulating layer 20 may be an inorganic insulating layer or may not be included at all. The organic insulating layer 20 may have an advantage in that a flat surface may be easily formed and/or an insulating layer having a small dielectric constant and a large thickness may be easily formed. In addition, while a third insulating layer 14 is provided between the substrate 12 and the gate metal layer 15 in this case, the third insulating layer 14 may not be provided. As will be described below with reference to FIG. 5, in an example in which a drive circuit TFT is formed on the active matrix substrate 100A, the third insulating layer 14 may be used as a gate insulating layer. Further, a base film (not shown) may be formed on the substrate 12 and underneath the third insulating layer 14.

As shown in FIG. 1(c), the gate metal layer 15 has a two-layer structure composed of a Ti layer 15a containing titanium and a Cu layer 15b containing copper and formed on the Ti layer 15a. Likewise, the source metal layer 18 has a two-layer structure composed of a Ti layer 18a containing titanium and a Cu layer 18b containing copper and formed on the Ti layer 18a. Here, the Ti layer containing titanium includes an alloy containing more than 50 mass % of titanium, and the Cu layer containing copper includes an alloy containing more than 50 mass % of copper. The alloy containing Ti and the alloy containing Cu contain, for example, aluminum (Al), nickel (Ni), tin (Sn), silicon (Si) or zinc (Zn). Typically, the Ti layer contains 95 mass % or more of titanium, and the Cu layer contains 95 mass % or more of copper, all of which preferably has a high purity of 99 mass % or more.

Figure 4:
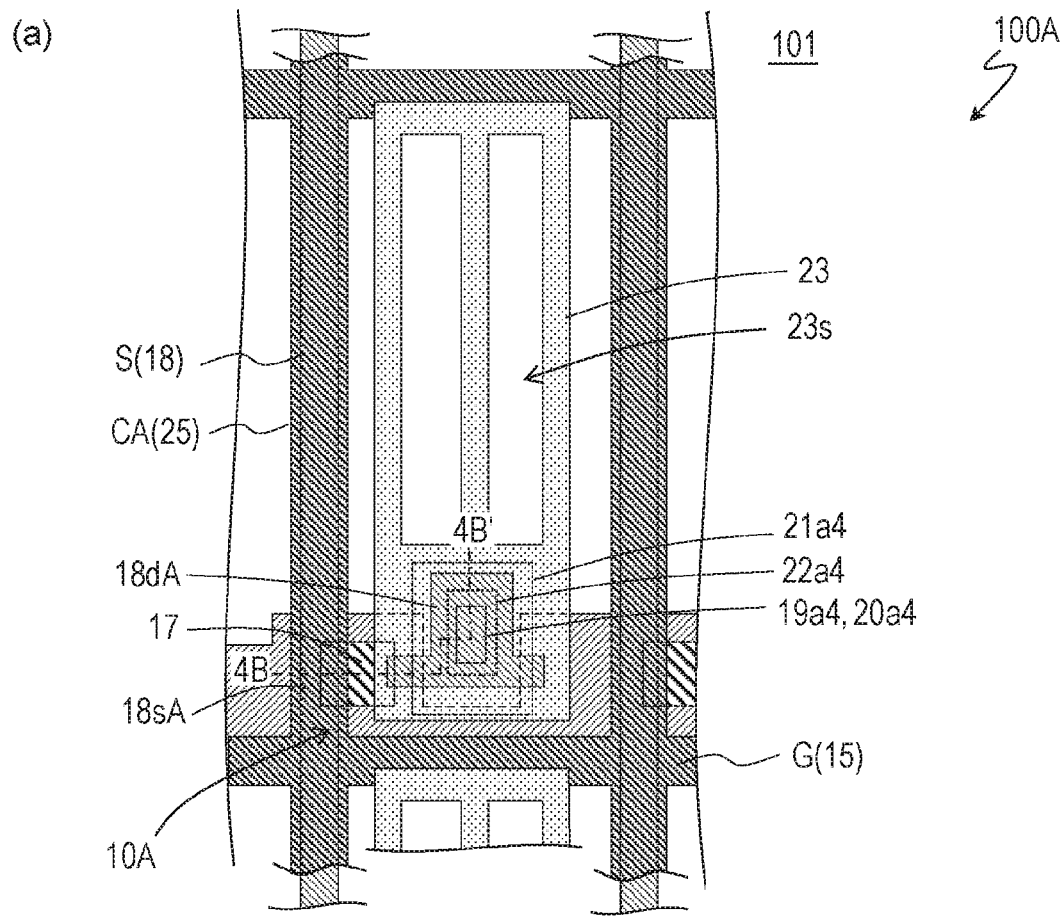
FIG. 4(a) is a schematic plan view of a pixel region of the TFT substrate 100A according to the embodiment of the present invention.
FIG. 4(b) is a schematic sectional view taken along line 4B-4B' in FIG. 4(a).
Figure 4:
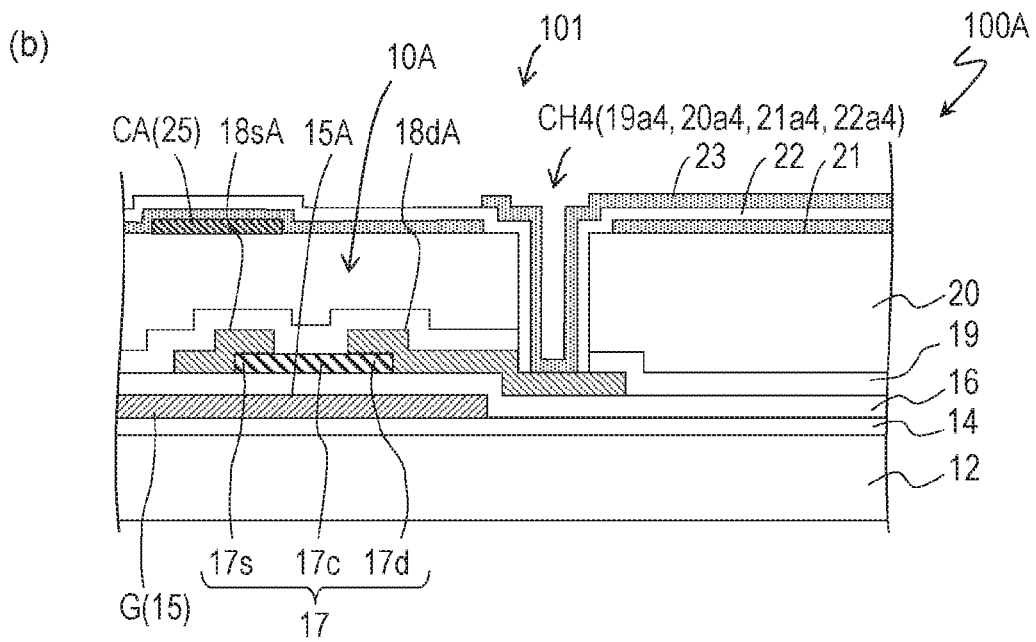

As described with reference to FIG. 4, for example, a first transparent conductive layer 21, a dielectric layer 22, and a second transparent conductive layer 23 are formed on the conductive layer 25. For example, the first transparent conductive layer 21 includes a common electrode, and the second transparent conductive layer 23 includes a pixel electrode. Conversely, the first transparent conductive layer 21 may include the pixel electrode, and the second transparent conductive layer 23 may include the common electrode. When used in a liquid crystal display device in a vertical electric field mode such as the vertical alignment (VA) mode, an auxiliary capacitor electrode may be formed of the first transparent conductive layer 21 and a pixel electrode may be formed of the second transparent conductive layer 23. In this case, the common electrode is provided on the liquid crystal layer side of the opposite substrate disposed to face the TFT substrate 100A with the liquid crystal layer interposed therebetween. That is, the conductive layer 25 is formed as an independent conductive layer separately from the first transparent conductive layer and the second transparent conductive layer, and does not include any one of a plurality of pixel electrodes, at least one common electrode, and at least one auxiliary capacitor electrode.

In addition, the conductive layer 25 does not have a Ti layer that is in contact with the Cu layer 15b of the gate metal layer 15. As shown in FIG. 1(c), for example, the conductive layer 25 has a two-layer structure composed of a transparent conductive layer 25a and a Cu layer 25b containing copper and formed on the transparent conductive layer 25a. The transparent conductive layer 25a is formed of an oxide conductive material. The oxide conductive material includes, for example, indium tin oxide (ITO), indium zinc oxide (IZO, "IZO" is registered trademark), zinc oxide (ZnO), or the like. The first transparent conductive layer 21 and the second transparent conductive layer 23 may also be formed using the same material as the transparent conductive layer 25a.

In the S-G connection portion of the TFT substrate 100A shown in FIG. 1(a), the conductive layer 25 is connected to the gate metal layer 15 within a contact hole CH1, and is connected to the source metal layer 18 within a contact hole CH2 formed at a position separated apart from the contact hole CH1. The contact hole CH1 includes a first opening 16a1 of the first insulating layer 16, a second opening 19a1 of the second insulating layer 19, and an opening 20a1 of the organic insulating layer 20, and the contact hole CH2 includes a second opening 19a2 of the second insulating layer 19 and an opening 20a2 of the organic insulating layer 20. The conductive layer 25 is connected to the gate metal layer 15 within the first opening 16a1 included in the contact hole CH1 and is connected to the source metal layer 18 within the second opening 19a2 included in the contact hole CH2.

On the other hand, in the S-G connection portion of the TFT substrate 100B shown in FIG. 1(b), the conductive layer 25 is connected to the gate metal layer 15 and connected to the source metal layer 18 within the contact hole CH3. The contact hole CH3 includes a first opening 16a3 of the first insulating layer 16, a second opening 19a3 of the second insulating layer 19, and an opening 20a3 of the organic insulating layer 20, and the conductive layer 25 is connected to the gate metal layer 15 within the first opening 16a3 and connected to the source metal layer 18 within the second opening 19a3.

As shown in FIG. 1(c), in the S-G connection portions of the TFT substrates 100A and 100B according to the embodiment of the present invention, since the conductive layer 25 is in contact with the gate metal layer 15 or the source metal layer 18, the gate metal layer 15 and the source metal layer 18 are not in direct contact with each other as in the direct type of in the related art. Therefore, in the S-G connection portions of the TFT substrates 100A and 100B according to the embodiment of the present invention, electrical connection failure does not arise, and a reduction in yield may be suppressed.

As will be described below with reference to FIG. 4, the TFT substrates 100A and 100B shown in FIGS. 1(a) and 1(b) further include, for example, a first thin film transistor 10A having a first gate electrode 15A that is formed of the gate metal layer 15, a first source electrode 18sA and a first drain electrode 18dA that are formed of the source metal layer 18, and a first semiconductor layer 17 that includes an oxide semiconductor and is formed on the first insulating layer 16. As will be described below with reference to FIG. 5, the TFT substrates 100A and 100B may further include, for example, a second thin film transistor 10B having a second semiconductor layer 13 containing silicon and formed on the substrate 12, a third insulating layer 14 that is formed between the second semiconductor layer 13 and the gate metal layer 15, a second gate electrode 15B that is formed of the gate metal layer 15, and a second source electrode 18sB and a second drain electrode 18dB that are formed of a source metal layer 18.

The conductive layer 25 may be, for example, a conductive layer for forming auxiliary wiring for lowering the electric resistance of the common electrode in the TFT substrate for the liquid crystal display panel in the FFS mode, as described below. Alternatively, the conductive layer 25 may be a conductive layer for forming a plurality of signal lines for transmitting and receiving a touch drive signal and a touch detection signal to and from the touch screen control circuit connected to at least one of a plurality of common electrodes on a TFT substrate for a liquid crystal display panel having a touch screen function.

Next, the configuration of the TFT substrate 100A for use in a liquid crystal display device in the FFS mode will be described in detail as an example with reference to FIGS. 2 to 5. The TFT substrate 100B used in the liquid crystal display device in the FFS mode may be obtained by configuring an S-G connection portion of a TFT substrate 100A having the structure described below to have the structure shown in FIG. 1(b).

Figure 2:
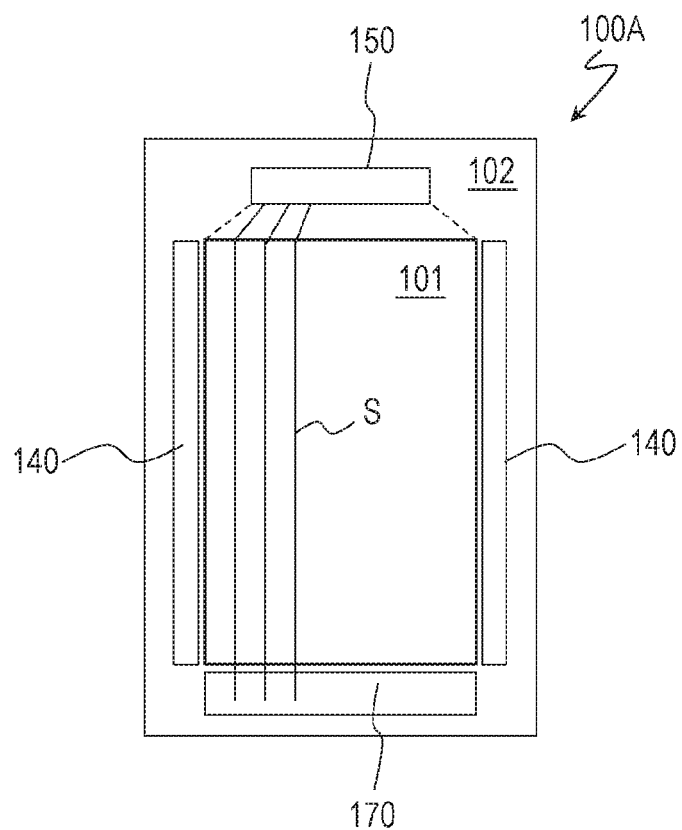
FIG. 2 is a schematic plan view of the entire TFT substrate 100A.

FIG. 2 is a schematic plan view showing the entire TFT substrate 100A.

As shown in FIG. 2, the TFT substrate 100A includes a display region 101 including a plurality of pixels and a region (non-display region) other than the display region 101. The non-display region includes a drive circuit formation region 102 in which a drive circuit is provided. In the drive circuit formation region 102, a gate driver circuit 140, a source driver circuit 150, and an inspection circuit 170 are provided, for example.

In the display region 101, a plurality of gate bus lines (not shown) extending in a row direction and a plurality of source bus lines S extending in a column direction are formed. Although not shown, respective pixels are defined by the gate bus lines and the source bus lines S, for example. The gate bus lines are connected to respective terminals of the gate driver circuit 140, and the source bus lines S are connected to respective terminals of the source driver circuit 150. It should be noted that only the gate driver circuit 140 may be monolithically formed on the TFT substrate 100A and the driver IC may be mounted as the source driver circuit 150. A first TFT 10A (see FIG. 4) is formed as a pixel TFT in each pixel of the display region 101 of the TFT substrate 100A, and a second TFT 10B (see FIG. 5) is formed as a circuit TFT in the drive circuit formation region 102.

The S-G connection portion of the TFT substrate 100A is a portion where the gate driver circuit 140 or the source driver circuit 150 provided in the drive circuit formation region 102 is connected to the gate bus line G or the source bus line S, and is provided to connect wiring or electrode formed of a source metal layer, and wiring or an electrode formed of a gate metal layer in the terminal portion (to be connected to an external circuit) provided in the drive circuit formation region 102, for example.

Figure 3:
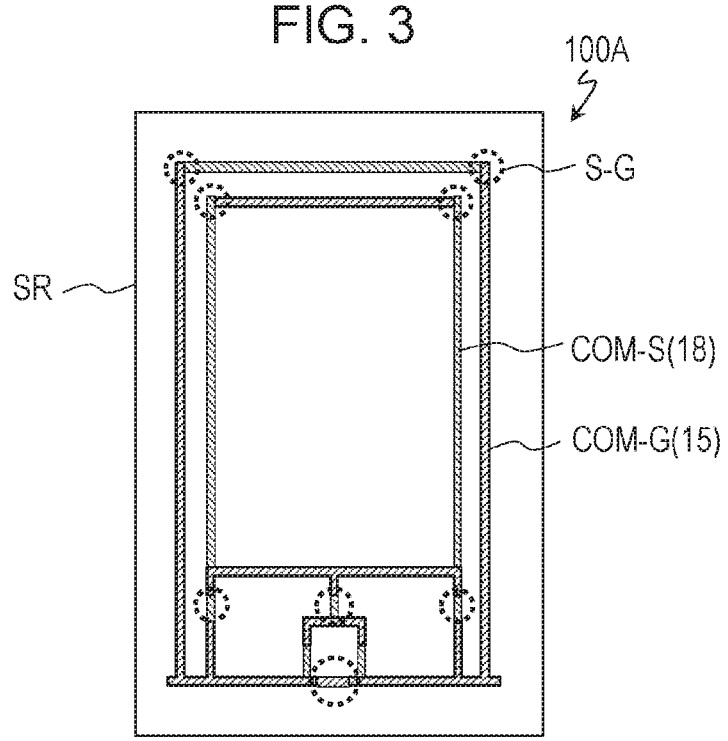
FIG. 3 is a schematic plan view showing an example of a position where the S-G connection portion is formed on the TFT substrate 100A.

FIG. 3 is a schematic plan view showing an example of a position where the S-G connection portion is formed in the TFT substrate 100A. In addition to the above, the S-G connection portion is also formed at the junctions (indicated by a phantom circle) of COM-G (15) and COM-S (18), as schematically shown in FIG. 3. Each of the COM-G (15) and COM-S (18) is wiring for applying the COM signal to the common electrode, and are included in the gate metal layer 15 and the source metal layer 18, respectively. Destruction of pixel TFT and/or circuit TFT due to static electricity may be suppressed by forming a plurality of rings at the COM-G (15) and COM-S (18).

The short ring SR is provided in order to prevent the pixel TFT and/or the circuit TFT from being destroyed by static electricity in the producing process of the TFT substrate 100A. Ultimately, the short ring SR is cut off together with a part of the glass substrate when the mother substrate is cut.

Figure 5:
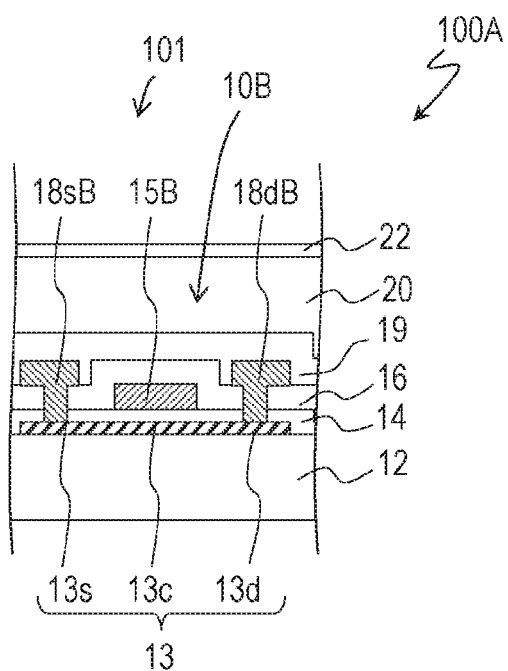
FIG. 5 is a schematic sectional view showing a circuit TFT 10B included in the TFT substrate 100A.

FIG. 4(a) is a schematic plan view showing the pixel region of the TFT substrate 100A, and FIG. 4(b) is a schematic sectional view taken along line 4B-4B' in FIG. 4(a). FIG. 5 is a schematic sectional view showing the circuit TFT 10B included in the TFT substrate 100A. First, the structure of the TFT 10A and the TFT 10B will be described.

The TFT substrate 100A includes a substrate 12, a first TFT 10A (FIG. 4) for pixels formed on the substrate 12, and a second TFT 10B for circuit (FIG. 5). The substrate 12 is a glass substrate, for example, and may have a base film (not shown) formed on the substrate 12. When the base film is formed, circuit elements such as the first TFT 10A and the second TFT 10B are formed on the base film. While the base film is not particularly limited, it may be an inorganic insulating film, and is a laminated film having a silicon nitride (SiNx) film, a silicon oxide (SiOx) film, or a silicon nitride film as a lower layer and a silicon oxide film as an upper layer, for example.

The first TFT 10A includes an active region mainly containing an oxide semiconductor. The second TFT 10B includes an active region mainly containing crystalline silicon. The first TFT 10A and the second TFT 10B are integrally formed on the substrate 12. The term "active region" as used herein refers to a region of a semiconductor layer of a TFT where a channel is formed. It is possible to obtain a liquid crystal display device having excellent display performance by using an oxide semiconductor TFT having a small off-leak current as the first TFT 10A for pixels and using a crystalline silicon TFT having high mobility as the second TFT 10B for the circuit. It should be noted that the TFT substrate according to the embodiment of the present invention is only required to have the S-G connection portion having the structure described with reference to FIG. 1, and the type and combination of TFTs are not limited.

As shown in FIG. 4(b), the first TFT 10A is a bottom gate type TFT and includes a gate electrode 15A, a first insulating layer 16 covering the gate electrode 15A, and an oxide semiconductor layer 17 disposed on the first insulating layer 16. Here, the gate electrode 15A is provided on the third insulating layer 14. The third insulating layer 14 is a gate insulating film of the second TFT 10B, and extends to a region where the first TFT 10A is formed. The gate electrode 15A is formed of the same conductive film as the gate electrode 15B of the second TFT 10B.

A portion of the first insulating layer 16, which is located between the gate electrode 15A and the oxide semiconductor layer 17, serves as a gate insulating film of the first TFT 10A. It is preferable that the first insulating layer 16 has a two-layer structure composed of a hydrogen-donor lower layer and an oxygen-donor upper layer, for example. The hydrogen-donor lower layer may be a silicon nitride (SiNx) layer, a silicon nitride oxide (SiNxOy: x>y) layer, or the like, mainly containing silicon nitride, for example. The oxygen-donor upper layer may be a silicon oxide (SiOx) layer, a silicon nitride oxide (SiOxNy: x>y) layer, or the like, which mainly contains silicon oxide, for example. In particular, when a SiOx layer is used as the oxygen-donor upper layer, a good channel interface may be formed at the interface with the oxide semiconductor layer 17.

The oxide semiconductor layer 17 includes a region 17c (active region) in which a channel is formed, and a source contact region 17s and a drain contact region 17d which are located on both sides of the active region, respectively. In this example, a portion of the oxide semiconductor layer 17, which is overlapped with the gate electrode 15A through the first insulating layer 16 interposed therebetween, is a channel region 17c. In addition, the first TFT 10A further includes a source electrode 18sA and a drain electrode 18dA connected to the source contact region 17s and the drain contact region 17d, respectively.

Here, the gate electrode 15A is formed as a part of the gate bus line G as shown in FIG. 4(a). That is, the portion of the gate bus line G, which is overlapped with the oxide semiconductor layer 17, corresponds to the gate electrode 15A, and the width direction of the gate bus line G corresponds to the channel width direction of the first TFT 10A. The source electrode 18sA is formed integrally with the source bus line S.

As shown in FIG. 5, the second TFT 10B includes a crystalline silicon semiconductor layer (for example, a low temperature polysilicon layer) 13 formed on the substrate 12, a third insulating layer 14 covering the crystalline silicon semiconductor layer 13, and a gate electrode 15B provided on the third insulating layer 14. A portion of the third insulating layer 14, which is located between the crystalline silicon semiconductor layer 13 and the gate electrode 15B, serves as a gate insulating film of the second TFT 10B. The crystalline silicon semiconductor layer 13 includes a region 13c (active region) in which a channel is formed, and a source region 13s and a drain region 13d which are located on both sides of the active region, respectively. In this example, the portion of the crystalline silicon semiconductor layer 13, which is overlapped with the gate electrode 15B through the third insulating layer 14 interposed therebetween, is an active region 13c. The second TFT 10B also includes a source electrode 18sB and a drain electrode 18dB connected to the source region 13s and the drain region 13d, respectively. The source electrode 18sB and the drain electrode 18dB may be provided on an interlayer insulating film (here, the first insulating layer 16) covering the gate electrode 15B and the crystalline silicon semiconductor layer 13, and may be connected to the crystalline silicon semiconductor layer 13 within a contact hole formed in the interlayer insulating film. As described above, the second TFT 10B is a top gate type TFT.

The TFTs 10A and 10B are covered with the second insulating layer 19 and the organic insulating layer 20. On the organic insulating layer 20, auxiliary wiring CA (25), a common electrode 21, a dielectric layer 22, and a pixel electrode 23 are formed in this order. The auxiliary wiring CA (25) is included in the conductive layer 25, includes auxiliary wiring extending parallel to the gate bus line G or the source bus line S, and is in direct contact with the common electrode (first transparent conductive layer) 21. The auxiliary wiring CA reduces the electric resistance of the common electrode 21. The auxiliary wiring CA shown in FIG. 4(a) includes a portion extending parallel to the gate bus line G and a portion extending parallel to the source bus line S, which are integrally formed and form a lattice. The arrangement of the auxiliary wiring CA may be appropriately modified so as not to lower the pixel opening ratio. In FIG. 4(a), the common electrode 21 is not illustrated. The common electrode 21 is formed in a region other than the opening 21a4 in FIG. 4(a).

The pixel electrode 23 includes a plurality of slits 23s. There may be only one slit 23s. The common electrode 21 is formed of the first transparent conductive layer 21, and the pixel electrode 23 is formed of the second transparent conductive layer 23.

The pixel electrode 23 is connected to the drain electrode 18dA within the contact hole CH4. The contact hole CH4 includes openings 19a4, 20a4, and 22a4 formed in the second insulating layer 19, the organic insulating layer 20 and the dielectric layer 22. The common electrode 21 is commonly provided for a plurality of pixels, and is connected to common wiring and/or a common electrode terminal portion (not shown), and is supplied with a common voltage (Vcom).

The oxide semiconductor included in the oxide semiconductor layer 17 may be an amorphous oxide semiconductor or a crystalline oxide semiconductor having a crystalline portion. Examples of the crystalline oxide semiconductor include a polycrystalline oxide semiconductor, a microcrystalline oxide semiconductor, a crystalline oxide semiconductor in which the c-axis is oriented substantially perpendicular to the layer surface, and the like.

The oxide semiconductor layer 17 may have a stacked structure of two or more layers. When the oxide semiconductor layer 17 has a stacked structure, the oxide semiconductor layer 17 may include an amorphous oxide semiconductor layer and a crystalline oxide semiconductor layer. Alternatively, a plurality of crystalline oxide semiconductor layers having different crystal structures may be included. In addition, a plurality of amorphous oxide semiconductor layers may be included. When the oxide semiconductor layer 17 has a two-layer structure including an upper layer and a lower layer, the energy gap of the oxide semiconductor included in the upper layer is preferably larger than the energy gap of the oxide semiconductor included in the lower layer. However, when the difference in energy gap between these layers is relatively small, the energy gap of the oxide semiconductor in the lower layer may be larger than the energy gap of the oxide semiconductor in the upper layer.

A material, a structure, a film forming method, a structure composed of an oxide semiconductor layer having a stacked structure, and the like, of the amorphous oxide semiconductor and each of the crystalline oxide semiconductors described above are described in Japanese Unexamined Patent Application Publication No. 2014-007399, for example. For reference, the description of Japanese Unexamined Patent Application Publication No. 2014-007399 is incorporated herein by reference in its entirety.

The oxide semiconductor layer 17 may include at least one metal element selected from among In, Ga, and Zn, for example. In this embodiment, the oxide semiconductor layer 17 includes an In—Ga—Zn—O-based semiconductor (for example, indium gallium zinc oxide), for example. Here, the In—Ga—Zn—O-based semiconductor is a ternary oxide of indium (In), gallium (Ga), zinc (Zn), and the ratio of In, Ga and Zn (composition ratio) is not particularly limited, but includes In:Ga:Zn=2:2:1, In:Ga:Zn=1:1:1, In:Ga:Zn=1:1:2, for example. Such an oxide semiconductor layer 17 may be formed of an oxide semiconductor film containing an In—Ga—Zn—O-based semiconductor.

The In—Ga—Zn—O-based semiconductor may be amorphous or crystalline. As a crystalline In—Ga—Zn—O-based semiconductor, a crystalline In—Ga—Zn—O-based semiconductor in which the c-axis is oriented substantially perpendicular to the layer surface is preferable.

The crystal structure of a crystalline In—Ga—Zn—O-based semiconductor is disclosed in Japanese Unexamined Patent Application Publication No. 2014-007399, Japanese Unexamined Patent Application Publication No. 2012-134475 and Japanese Unexamined Patent Application Publication No. 2014-209727 described above, for example. For the sake of reference, the description of Japanese Unexamined Patent Application Publication No. 2012-134475 and Japanese Unexamined Patent Application Publication No. 2014-209727 are incorporated herein by reference in their entirety. Since a TFT having an In—Ga—Zn—O-based semiconductor layer has high mobility (more than 20 times as compared with a-SiTFT) and low leak current (less than 1/100th of that of a-Si TFT), it is suitably used as a pixel TFT (TFT provided in a pixel).

The oxide semiconductor layer 17 may include other oxide semiconductors instead of the In—Ga—Zn—O-based semiconductor. For example, it may include In—Sn—Zn—O-based semiconductor (for example, $In_2O_3$—$SnO_2$—ZnO; InSnZnO). The In—Sn—Zn—O-based semiconductor is a ternary oxide of indium (In), tin (Sn) and zinc (Zn). Alternatively, the oxide semiconductor layer 17 may be formed of an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a cadmium oxide (CdO), a Mg—Zn-0-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, and the like. The thickness of the oxide semiconductor layer 17 is 30 nm or more and 200 nm or less, for example.

The semiconductor layer 13 containing silicon preferably contains crystalline silicon. Here, "crystalline silicon" includes polycrystalline silicon as well as at least partially crystallized silicon such as microcrystalline silicon (μC-Si). The polycrystalline silicon is low temperature polysilicon (LTPS), for example. As is well known, the low temperature polysilicon is formed by irradiating amorphous silicon deposited on a substrate with laser light to melt and crystallize the same (laser annealing). The thickness of the semiconductor layer 13 containing silicon is 30 nm or more and 70 nm or less, for example.

The gate metal layer 15 and the source metal layer 18 have a two-layer structure composed of a Ti layer containing titanium and a Cu layer containing copper and formed on the Ti layer. The thicknesses of the gate metal layer 15 and the source metal layer 18 are 50 nm or more and 500 nm or less, for example. The thickness of the upper Cu layer is 300 nm, for example, and the thickness of the lower Ti layer is 30 nm, for example.

The first transparent conductive layer 21 and the second transparent conductive layer 23 are independently formed of indium tin oxide (ITO), indium zinc oxide (IZO, "IZO" is a registered trademark), zinc oxide (ZnO), or the like, for example. The thicknesses of the first transparent conductive layer 21 and the second transparent conductive layer 23 are independently 50 nm or more and 150 nm or less, for example.

The thickness of the conductive layer 25 is 100 nm or more and 250 nm or less, for example. When the conductive layer 25 includes the transparent conductive layer 25a and the Cu layer 25b, the thickness of the transparent conductive layer 25a is 50 nm or more and 150 nm or less, for example, and the thickness of the Cu layer 25b is 100 nm or more and 200 nm or less, for example.

A first insulating layer 16 (thickness: 180 nm or more and 550 nm or less, for example), a second insulating layer 19 (thickness: 150 nm or more and 700 nm or less, for example), a third insulating layer 14 (thickness: 50 nm or more and 130 nm or less, for example) and a dielectric layer 22 (thickness: 50 nm to 300 nm) are an inorganic insulating layer, such as a silicon nitride (SiNx) layer, a silicon nitride oxide (SiNxOy: x>y) layer, a silicon oxide (SiOx) layer, and a silicon oxynitride (SiOxNy: x>y) layer, for example.

As described above, the first insulating layer 16 preferably has a two-layer structure of a hydrogen-donor lower layer and an oxygen-donor upper layer. Further, it is preferable that the second insulating layer 19 is a laminated film having a lower layer formed from a SiOx film (thickness: 100 nm or more and 400 nm or less, for example) and an upper layer formed from a SiNx film (thickness: 50 nm or more and 300 nm or less, for example). In such a case, since the lower layer of the second insulating layer 19 forms the back channel of the first TFT 10A, it is preferably an SiOx film. It is preferable that the upper layer is a SiNx film having a high passivation effect to protect against moisture and impurities. The upper layer may not be applied.

The organic insulating layer 20 is formed of an acrylic transparent resin having a positive type photosensitive property, for example. The thickness of the organic insulating layer 20 is 1 μm or more and 3 μm or less, for example.

The gate metal layer 15 and the source metal layer 18 have a two-layer structure composed of a Ti layer containing titanium and a Cu layer containing copper and formed on the Ti layer. The thicknesses of the gate metal layer 15 and the source metal layer 18 are independently 50 nm or more and 500 nm or less, for example. The thickness of the upper Cu layer is 300 nm and the thickness of the lower Ti layer is 30 nm.

A first method for producing a TFT substrate according to an embodiment of the present invention includes the following steps, for example. According to the first method for producing a TFT substrate, both the TFT substrate 100A shown in FIG. 1(a) and the TFT substrate 100B shown in FIG. 1(b) may be produced. Each of the following steps may be performed by using a known film forming method and patterning method (for example, photolithography process and etching process).

Step a1: preparing a substrate 12

Step b1: forming a gate metal layer 15 on the substrate 12

Step c1: depositing a first insulating film on the gate metal layer 15

Step d1: forming a semiconductor layer 17 on the first insulating film

Step e1: forming a first opening 16a1 in the first insulating film to obtain a first insulating layer 16

Step f1: forming a source metal layer 18 on the semiconductor layer 17

Step g1: depositing a second insulating film on the source metal layer 18 and forming second openings 19a1, 19a2, and 19a3 in the second insulating film to obtain a second insulating layer 19

Step h1: forming a conductive layer 25 on the second insulating layer 19

When the conductive layer 25 includes the ITO layer 25a and the Cu layer 25b, when an aqueous solution (for example, ELM-K 255 (manufactured by Mitsubishi Gas Chemical Company)) containing hydrogen peroxide, nitric acid, tetramethylammonium hydroxide and ammonium hydrogen difluoride is used as the etchant, two layers can be simultaneously etched.

When the TFT substrate 100A is produced, a step of forming the third insulating layer 14 is added between step a1 and step b1. In addition, a step of forming the organic insulating layer 20 having the predetermined openings 20a1, 20a2, and 20a3 is added between step g1 and step h1. In addition, a process of producing the TFT 10B is performed in parallel.

After step h1, a transparent conductive layer to be formed as a pixel electrode, a common electrode, or an auxiliary capacitor electrode is formed according to a liquid crystal display device in which the TFT substrate is used. In producing the TFT substrate 100A, a first transparent conductive layer 21 including a common electrode is formed. Then, according to a known method, the second transparent conductive layer 23 including the dielectric layer 22 and the pixel electrode is formed, followed by forming of an optional inorganic protective layer, and then forming of an alignment film, so that a TFT substrate 100A is obtained.

According to the method for producing a TFT substrate described above, the first opening 16a1 and the second opening 19a2 may be provided at different positions (see FIG. 1(a)), while the first opening 16a3 and the second opening 19a3 may be provided at the same position (the first opening 16a3 within the second opening 19a3) (see FIG. 1(b)).

A second method for producing a TFT substrate according to an embodiment of the present invention includes the following steps, for example. According to the second method for producing a TFT substrate, the TFT substrate 100B having the S-G connection portion shown in FIG. 1(b) may be produced.

Step a2: preparing a substrate 12
Step b2: forming a gate metal layer 15 on the substrate 12
Step c2: depositing a first insulating film on the gate metal layer 15
Step d2: forming a semiconductor layer 17 on the first insulating film
Step e2: forming a source metal layer 18 on the semiconductor layer 17
Step f2: depositing a second insulating film on the source metal layer 18 and forming a second opening 19a3 in the second insulating film, and then forming a first opening 16a3 in the first insulating film to obtain a first insulating layer 16 and a second insulating layer 19
Step g2: forming a conductive layer 25 on the second insulating layer 19

When the TFT substrate 100B is produced, a step of forming a third insulating layer 14 is added between step a2 and step b2. Further, in step f2, after the second insulating film is deposited and before the second opening 19a3 is formed in the second insulating layer, a step of forming an organic insulating layer and forming an opening 20a3 in the organic insulating film is added. In addition, a process of producing the TFT 10B is performed in parallel.

After step g2, a transparent conductive layer to be formed as a pixel electrode, a common electrode, or an auxiliary capacitor electrode is formed according to a liquid crystal display device in which the TFT substrate is used. In producing the TFT substrate 100B, a first transparent conductive layer 21 including a common electrode is formed. Then, according to a known method, the second transparent conductive layer 23 including the dielectric layer 22 and the pixel electrode is formed, followed by forming of an optional inorganic protective layer, and then forming of an alignment film, so that a TFT substrate 100B is obtained.

In the embodiment described above, the channel etch type TFT 10A is exemplified, but an etch stop type TFT may also be used. In the channel etch type TFT, for example, as shown in FIG. 4(b), no etch stop layer is formed on the channel region 17c, and the lower surface of an end portion on the channel side of the source electrode 18sA and the drain electrode 18dA is disposed to be in contact with an upper surface of the oxide semiconductor layer 17. The channel etch type TFT is formed by forming a conductive film for the source metal layer on the oxide semiconductor layer 17 and performing the source and the drain separation, for example. In the source and the drain separation step, a surface portion of the channel region 17c may be etched, in some cases.

Meanwhile, in the TFT (etch stop type TFT) in which the etch stop layer (not shown) is formed on the channel region 17c, a lower surface of the end portion on the channel side of the source electrode 18sA and drain electrode 18dA is located on the etch stop layer, for example. The etch stop type TFT is formed by forming an etch stop layer that covers a portion to be a channel region 17c in the oxide semiconductor layer 17, and then forming a conductive film for a source metal layer on the oxide semiconductor layer 17 and the etch stop layer to separate the source and the drain for example. When the second method for producing a TFT substrate is adopted, it is preferable to form the etch stop layer on the semiconductor layer 17 before forming the source metal layer 18 on the semiconductor layer 17 in step e2.

The TFT substrates 100A and 100B are TFT substrates for a liquid crystal display device in the FFS mode, and have a configuration in which a common electrode is disposed below the pixel electrode (on a side far from the liquid crystal layer) and a slit is formed in the pixel electrode. Conversely, a configuration in which the pixel electrode is disposed below the common electrode and the slit is formed in the common electrode is also known. The arrangement of the common electrode and the pixel electrode of the TFT substrates 100A and 100B may be reversed.

The liquid crystal display panel in the FFS mode provided with the TFT substrate 100A or 100B includes the TFT substrate 100A or 100B and an opposite substrate disposed to face the TFT substrate through a liquid crystal layer interposed therebetween. The opposite substrate includes a light shielding layer formed on a glass substrate and a color filter layer, for example. The light shielding layer is formed by patterning a Ti film having a thickness of 200 nm in a desired pattern, for example. A color filter layer is formed by using a photosensitive dry film, for example, and includes R, G, B color filters arranged corresponding to pixels, for example. In addition, photo spacers may be disposed as necessary. While it is not described in the above description, an alignment film is formed on the surfaces of the TFT substrate and the opposite substrate, which are in contact with the liquid crystal layer. A known alignment film may be appropriately used depending on the orientation of the liquid crystal layer.

In addition, when the TFT substrate 100A or 100B is used in a liquid crystal display device in a vertical electric field mode such as the vertical alignment (VA) mode, an auxiliary capacitor electrode may be formed in the first transparent conductive layer 21 and a pixel electrode may be formed in the second transparent conductive layer 23. At this time, the common electrode is provided on the liquid crystal layer side of the opposite substrate disposed to face the TFT substrate 100A or 100B through the liquid crystal layer interposed therebetween.

Next, the structure of the TFT substrate 200 used for a display device having a touch screen function (also referred to as "touch panel") will be described with reference to FIGS. 6 to 8. In the following, a liquid crystal display device in the FFS mode, which is same as that described above, will be exemplified. Since it is apparent to those skilled in the art that the TFT substrate 200 may be produced by the same method for producing as that of the TFT substrate 100A described above, the method for producing the TFT substrate 200 is not described. The TFT substrate 200 also includes an S-G connection portion having the structure shown in FIG. 1(a) or 1(b). Hereinafter, the structure of the display region of the TFT substrate 200 will be mainly described. In the following description, components of the TFT substrate 200 are denoted by reference numerals incremented by adding 200 to the reference numerals of the corresponding components of the TFT substrate 100A. Therefore, the TFT substrate 200 includes a substrate 212, a gate metal layer 215, a first insulating layer 216, an oxide semiconductor layer 217, a source metal layer 218, a second insulating layer 219, an organic insulating layer 220, a conductive layer 225, a first transparent conductive layer 221, and a second transparent conductive layer 223.

Figure 6:
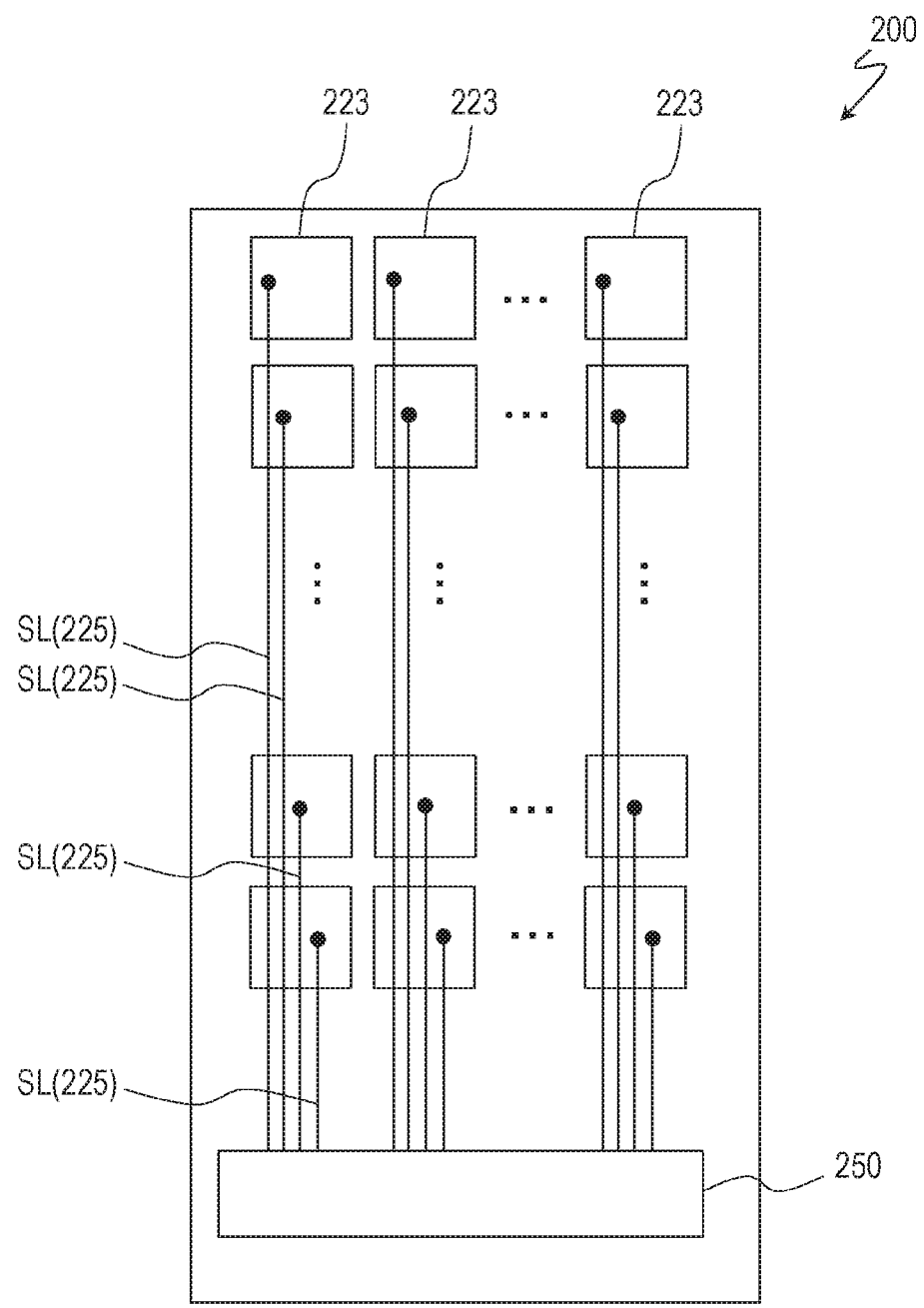
FIG. 6 is a schematic plan view for explaining a touch screen structure of a TFT substrate 200 according to another embodiment of the present invention.

FIG. 6 is a schematic plan view for explaining a touch screen structure (components for realizing touch screen function) in the TFT substrate 200.

As shown in FIG. 6, in the TFT substrate 200, the touch screen structure includes a plurality of common electrodes 223 arranged in a matrix having rows and columns, a plurality of signal lines SL (225) extending parallel to the source bus lines, and a touch screen control circuit 250, in which each of the plurality of signal lines SL (225) is connected to any one of the plurality of common electrodes 223, and a touch drive signal and a touch detection signal are transmitted and received to and from the touch screen control circuit 250 from and to the plurality of signal lines SL (225). In FIG. 6, one signal line SL (225) is connected to one common electrode 223, but two or more signal lines SL (225) may be connected to one common electrode 223. For example, variations in the electrical load (CR) of the path from the touch screen control circuit 250 to each common electrode 223 through the signal line SL (225) may be reduced.

The liquid crystal display device in the FFS mode having such a touch screen function is described in Japanese Patent Application No. 2015-145097 and Japanese Patent Application No. 2016-115573, for example. For reference, the description of Japanese Patent Application No. 2015-145097 and Japanese Patent Application No. 2016-115573 are incorporated herein by reference in their entirety. The TFT substrate 200 includes a gate driver circuit, a source driver circuit, and an inspection circuit, separately.

Figure 7:
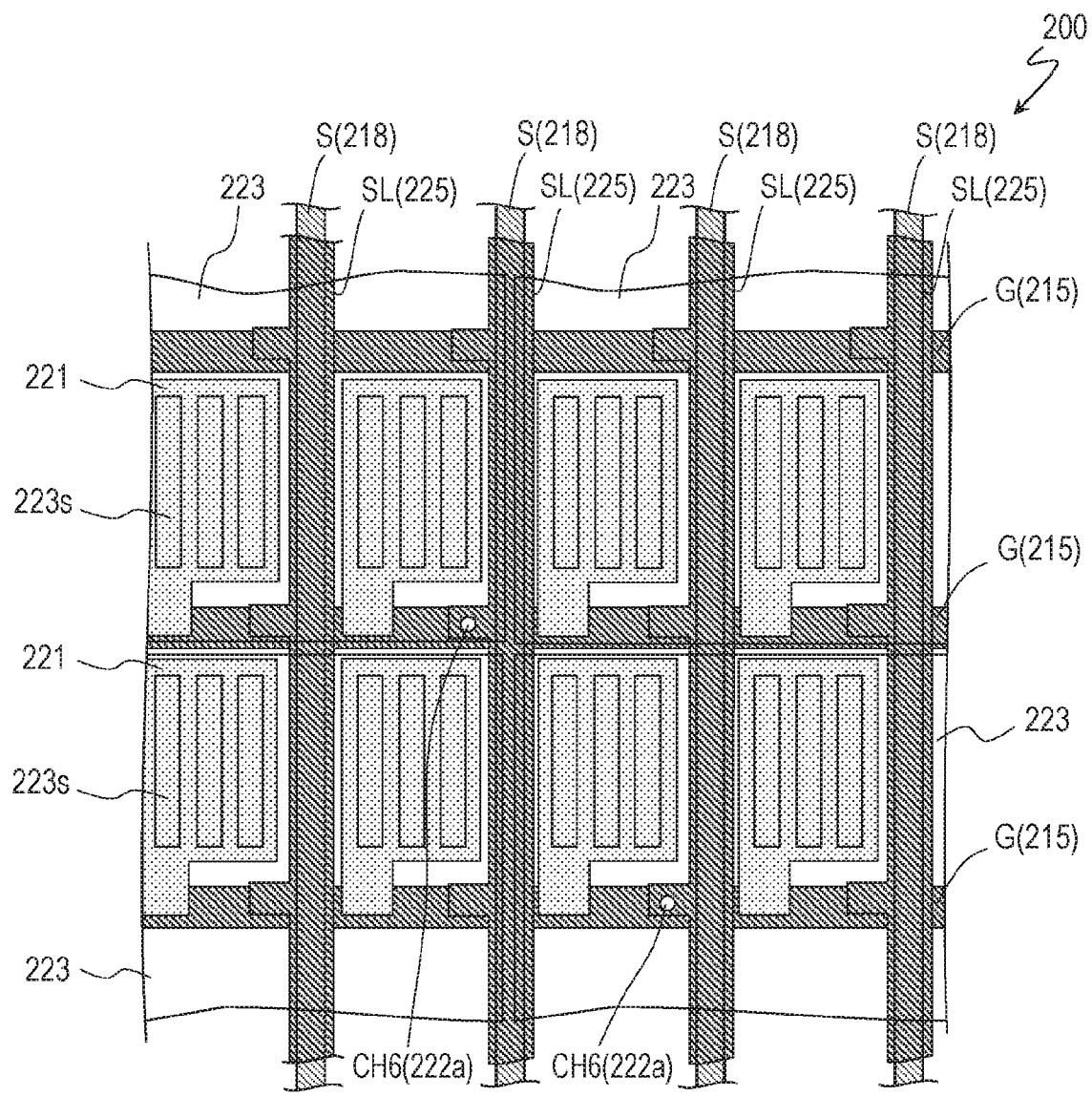
FIG. 7 is a schematic plan view of the TFT substrate 200, and is a view for explaining the relationship between an arrangement of pixels and the touch screen structure.
Figure 8:
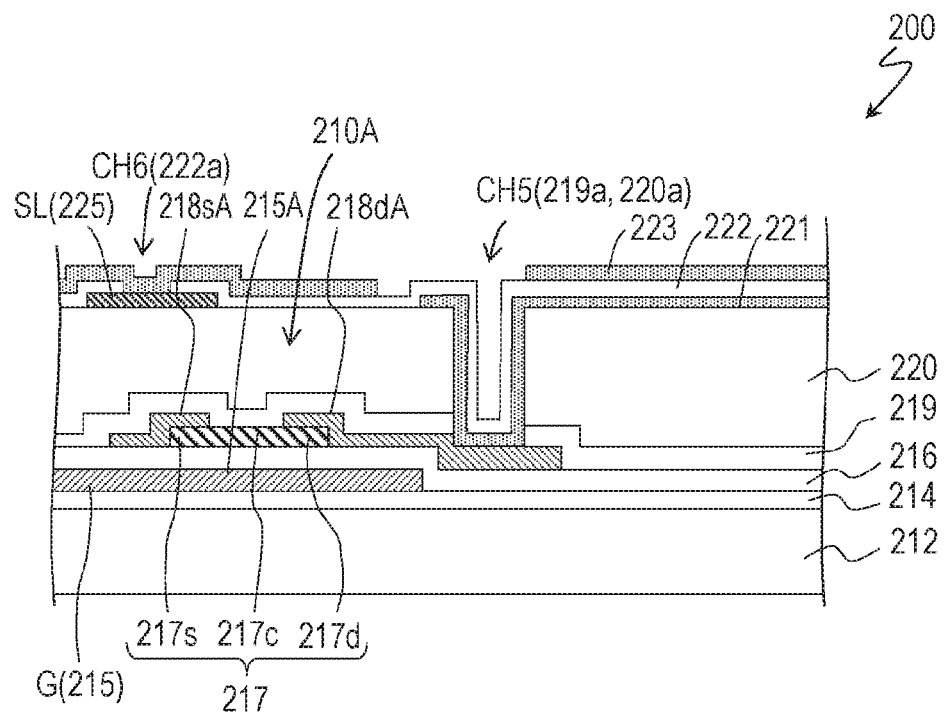
FIG. 8 is a schematic sectional view of a pixel region of the TFT substrate 200.

Attention is now invited to FIGS. 7 and 8. FIG. 7 is a schematic plan view of the TFT substrate 200, and is a view for explaining the relationship between the arrangement of pixels and the touch screen structure. FIG. 8 is a schematic sectional view of a pixel region of a TFT substrate 200.

The TFT substrate 200 includes the pixel TFT 210A shown in FIG. 8. The TFT substrate 200 may further include a driving TFT having the same structure as the circuit TFT 10B (see FIG. 5) of the TFT substrate 100A. In FIG. 7, although the TFT 210A is not shown, it is provided in the vicinity of a portion where the pixel electrode 221 and the gate bus line G (215) is overlapped with each other.

Unlike the TFT substrate 100A, the TFT substrate 200 includes the pixel electrode 221 disposed below the common electrode 223 (the side far from the liquid crystal layer), and the common electrode 223 including the slit 223s. That is, the pixel electrode 221 is formed of the first transparent conductive layer 221, and the common electrode 223 is formed of the second transparent conductive layer 223. In FIG. 7, the common electrode (second transparent conductive layer) 223 disposed in the uppermost layer is illustrated without hatching. In FIG. 7, two set of common electrodes 223 adjacent to each other on the second source bus line S (218) from the left are shown. Each common electrode 223 is provided to correspond to the plurality of pixel electrodes 221. The number of the pixel electrodes 221 corresponding to one common electrode 223 may be appropriately set depending on the definition of the display panel and the touch position resolution of the touch screen.

As shown in FIG. 8, the first TFT 210A is a bottom gate type TFT and includes a gate electrode 215A, a first insulating layer 216 covering the gate electrode 215A, and an oxide semiconductor layer 217 disposed on the first insulating layer 216.

A portion of the first insulating layer 216, which is located between the gate electrode 215A and the oxide semiconductor layer 217, serves as a gate insulating film of the first TFT 210A. The oxide semiconductor layer 217 includes a region 217c (active region) in which a channel is formed, and a source contact region 217s and a drain contact region 217d which are located on both sides of the active region, respectively. In addition, the first TFT 210A further includes a source electrode 218sA and a drain electrode 218dA connected to the source contact region 217s and the drain contact region 217d, respectively.

The TFT 210A is covered with the second insulating layer 219 and the organic insulating layer 220. On the organic insulating layer 220, a signal line SL (225), a pixel electrode (first transparent conductive layer) 221, a dielectric layer 222, and a common electrode (second transparent conductive layer) 223 are formed in this order. The pixel electrode (first transparent conductive layer) 221 is connected to the drain electrode 218dA within the contact hole CH5. The contact hole CH5 includes openings 219a and 220a formed in the second insulating layer 219 and the organic insulating layer 220. The common electrode (second transparent conductive layer) 223 is provided in common for a predetermined number of pixels, and includes a slit 223s.

The signal line SL (225) is included in the conductive layer 225, includes auxiliary wiring extending in parallel with the source bus line S, and is in contact with the common electrode (second transparent conductive layer) 223 within the contact hole CH6 (opening 222a) of the dielectric layer 222.

In this way, in the TFT substrate 200, the conductive layer 225 for forming the signal line SL having the touch screen structure may be used as the conductive layer 225 of the S-G connection structure.

INDUSTRIAL APPLICABILITY

The embodiment according to the present invention is suitably used for an active matrix type display device such as a liquid crystal display device and an organic EL display device, and further for a display device having a touch screen function.

REFERENCE SIGNS LIST

10A First thin film transistor
10B Second thin film transistor
12 Substrate
13 Crystalline silicon semiconductor layer
13 Silicon semiconductor layer
13c Active region
13d Drain region
13s Source region
14, 244 Insulating layer
15, 215 Gate metal layer
15a Ti layer
15b Cu layer
15A, 15B, 215A Gate electrode
16, 216 First insulating layer
17, 217 Oxide semiconductor layer
17c Channel region
17d Drain contact region
17s Source contact region
18dA Drain electrode
18dB Drain electrode
18sA Source electrode
18sB Source electrode
19, 219 Second insulating layer
19a, 219a Opening
20, 220 Organic insulating layer
20a, 220a Opening
21, 221 First transparent conductive layer
22, 222 Dielectric layer
22a, 222a Opening
23, 223 Second transparent conductive layer
23s, 223s Slit
25, 225 Conductive layer
100A, 100B, 200 TFT substrate
101 Drive circuit formation region
102 Display region
140 Gate driver circuit
150 Source driver circuit
170 Inspection circuit
250 Touch screen control circuit

The invention claimed is:
1. An active matrix substrate comprising:
a substrate;
a gate metal layer that is supported on the substrate and has a two-layer structure composed of a Ti layer containing titanium, and a Cu layer containing copper and formed on the Ti layer;
a first insulating layer formed on the gate metal layer;
a source metal layer that is formed on the first insulating layer and has a two-layer structure composed of a Ti layer containing titanium, and a Cu layer containing copper and formed on the Ti layer;
a second insulating layer formed on the source metal layer;
a conductive layer that is formed on the second insulating layer, and is in contact with the gate metal layer within a first opening formed in the first insulating layer and is in contact with the source metal layer within a second opening formed in the second insulating layer; and
a first transparent conductive layer that is formed on the conductive layer, and includes any of a plurality of pixel electrodes, at least one common electrode, and at least one auxiliary capacitor electrode;
a first thin film transistor that includes a first gate electrode formed of the gate metal layer, a first source electrode and a first drain electrode which are formed of the source metal layer, and a first semiconductor layer including an oxide semiconductor and formed on the first insulating layer;
a gate bus line integrally formed with the first gate electrode;
a source bus line integrally formed with the source bus line;
a dielectric layer formed on the conductive layer;
a second transparent conductive layer formed on the dielectric layer; and
a second thin film transistor that includes a second semiconductor layer containing silicon and formed on the substrate, a third insulating layer formed between the second semiconductor layer and the gate metal layer, a second gate electrode formed of the gate metal layer, and a second source electrode and a second drain electrode which are formed of the source metal layer, wherein
the conductive layer does not include any of the plurality of pixel electrodes, the at least one common electrode, and the at least one auxiliary capacitor electrode, and does not have a Ti layer being in contact with the Cu layer of the gate metal layer,
the first transparent conductive layer includes the plurality of pixel electrodes,
the at least one common electrode is a plurality of common electrodes arranged in a matrix having rows and columns, and the second transparent conductive layer includes the plurality of common electrodes,
the conductive layer includes a plurality of signal lines extending parallel to the source bus line, and
each of the plurality of signal lines is connected to at least one of the plurality of common electrodes, and the plurality of signal lines transmit and receive a touch drive signal and a touch detection signal to and from a touch screen control circuit.

2. The active matrix substrate according to claim 1, wherein the conductive layer has a two-layer structure composed of a transparent conductive layer, and a Cu layer containing copper and formed on the transparent conductive layer.

3. The active matrix substrate according to claim 2, wherein the transparent conductive layer is formed of ITO.

4. The active matrix substrate according to claim 1, wherein the oxide semiconductor includes an In—Ga—Zn—O-based semiconductor.

5. The active matrix substrate according to claim 4, wherein the oxide semiconductor includes a crystalline In—Ga—Zn—O-based semiconductor.

6. The active matrix substrate according to claim 1, wherein the first semiconductor layer has a stacked structure.

7. The active matrix substrate according to claim 1, wherein the first thin film transistor is a channel etch type.

8. The active matrix substrate according to claim 1, wherein the second semiconductor layer includes crystalline silicon.

9. The active matrix substrate according to claim 8, wherein the crystalline silicon is polycrystalline silicon.

10. A method for producing the active matrix substrate according to claim 1, the method comprising:
a step of preparing the substrate;
a step of forming the gate metal layer on the substrate;

a step of depositing a first insulating film on the gate metal layer;
a step of forming the first semiconductor layer on the first insulating film;
a step of forming the first opening in the first insulating film to obtain the first insulating layer;
a step of forming the source metal layer on the first semiconductor layer;
a step of depositing a second insulating film on the source metal layer and forming the second opening in the second insulating film to obtain the second insulating layer; and
a step of forming the conductive layer on the second insulating layer.

11. A method for producing the active matrix substrate according to claim 1, the method comprising:
a step of preparing the substrate;
a step of forming the gate metal layer on the substrate;
a step of depositing a first insulating film on the gate metal layer;
a step of forming the first semiconductor layer on the first insulating film;
a step of forming the source metal layer on the first semiconductor layer;
a step of depositing a second insulating film on the source metal layer, forming the second opening in the second insulating film, and then forming the first opening in the first insulating film to obtain the first insulating layer and the second insulating layer; and
a step of forming the conductive layer on the second insulating layer.

* * * * *